United States Patent [19]

Kunz

[11] Patent Number: 5,597,868
[45] Date of Patent: Jan. 28, 1997

[54] POLYMERIC ANTI-REFLECTIVE COMPOUNDS

[75] Inventor: Roderick R. Kunz, Acton, Mass.

[73] Assignee: Massachusetts Institute of Technology, Cambridge, Mass.

[21] Appl. No.: 206,595

[22] Filed: Mar. 4, 1994

[51] Int. Cl.$^6$ ............................. C08L 61/10; C08L 33/12
[52] U.S. Cl. ........................ 525/154; 525/451; 525/502; 525/508
[58] Field of Search ................................... 525/154, 502, 525/508, 451

[56] References Cited

U.S. PATENT DOCUMENTS

| | | | |
|---|---|---|---|
| 4,491,628 | 1/1985 | Ito et al. | 430/176 |
| 4,910,122 | 3/1990 | Arnold et al. | 430/313 |
| 5,045,431 | 9/1991 | Allen et al. | 430/270 |
| 5,071,730 | 12/1991 | Allen et al. | 430/270 |
| 5,190,992 | 3/1993 | Kato et al. | 522/180 |

OTHER PUBLICATIONS

Yen et al., "An Anti–Reflective Coating for Use with PMMA at 193 nm", J. Electrochem Soc., vol. 139, No. 2, pp. 616–619 (1992).

Horn, "Antireflection Layers and Planarization for Microlithography", Solid State Technology, pp. 57–62 (1991).

"A New Multifunctional Coating that Replaces Adhesion Promoter, Anti–reflective Coating and Release Layer with One Easy to Apply Coat for Photolithography", Brewer Science, Inc.

*Primary Examiner*—W. Robinson H. Clark
*Attorney, Agent, or Firm*—Thomas J. Engellenner; Lahive & Cockfield

[57] ABSTRACT

Anti-reflective coatings and methods for forming these anti-reflective coatings are disclosed that have a polymer chemistry and optical characteristics suitable for suppressing the light that reflects off a circuit substrate during a photolithographic process. These anti-reflective coatings include a phenolic polymer material and an epoxide-containing polymer material that can be combined in a select proportion to form a thermally curable polymeric anti-reflective coating. The select proportions of the combined materials tailors the optical characteristic of the anti-reflective coating to attenuate energy about a select range of wavelengths.

8 Claims, 4 Drawing Sheets

POLYMERIC ANTI-REFLECTIVE COMPOUNDS

This invention was made with government support under Contact Number F19628-90-C0002 awarded by the Air Force. The government has certain rights in the invention.

BACKGROUND OF THE INVENTION

The technical field of this invention is photo-lithography and, in particular, anti-reflective chemical compounds that attenuate light reflected or scattered by conductor surfaces during device fabrication.

Photo-lithography encompasses a variety of photo-chemical processes used to fabricate integrated circuits. As is generally known, an integrated circuit is typically formed from a small silicon wafer, called a substrate, that has incorporated onto its surface a complete electronic circuit. Each complete circuit is a dense and complex matrix of circuit elements including transistors, capacitors, and wires. As integrated circuits become increasingly dense, the incorporated circuit elements must be made increasingly smaller. Presently, photolithographic processes can produce circuit elements with feature dimensions of approximately one-half a micrometer. Achieving more complex and powerful integrated circuits requires a photolithographic process capable of fabricating circuit elements with design features of about one-quarter of a micrometer. A major obstacle to achieving these sub-micrometer design features is the scattered light that reflects off the substrate during photolithography and interferes with the desired exposure profiles.

Reflected light affects the exposure step of the photolithographic process. During the exposure step, a photosensitive film, called a photo-resist, is exposed to actinic radiation. Typically, the exposure is accomplished by radiating the film with light of a select wavelength through a patterned mask. The exposed resist defines the pattern that is transferred to the substrate, and ultimately incorporated into the integrated circuit. A precise exposure regimen is essential to transfer sub-micrometer design features to the resist. The exposure regimen must control the amount of light absorbed in the photo-resist, and the pattern area affected by the radiation. Both the dose delivered and the pattern transferred must be correct to achieve proper control of sub-micrometer circuit element dimensions.

The accuracy of the exposure regimen is adversely affected by light that reflects off the substrate and travels back through the photo-resist. Such reflected light can travel through previously unexposed photo-resist and essentially "rewrite" the pattern that was transferred. Alternatively, reflected light can travel back through the exposed photo-resist and interfere with the incident radiation to vary the dose of radiation that is delivered to the photo-resist. Depending on the resist thickness, the resulting interference may be constructive or destructive, causing the dose necessary to develop the resist to change as a function of resist thickness. Variations in resist thickness of as little as 10 nm can yield a 10 percent change in absorbed dose intensity. This sensitivity to resist thickness is accentuated at the shorter wavelengths which are necessary to achieve sub-micrometer design features. Collectively, the deleterious effects of reflected light are referred to as interference effects. These interference effects manifest themselves as non-vertical resist profiles, line width variations and reflective notching.

Some materials and methods have been proposed for reducing the amount of light that is reflected off substrates and/or underlying circuit elements during resist patterning. One method alters the exposure tool so that the photo-resist is radiated with multiple wavelengths. This method provides some benefit by making the process less sensitive to the constructive or destructive interference of one particular wavelength. However, it does not substantially reduce the amount of light reflected through unexposed photo-resist regions during the exposure step nor are the multiple wavelengths amenable to forming sub-micrometer design features. Furthermore, multiple-wavelength exposures place a great demand for color-corrected optics, and are hence not often used.

An alternative method to minimize the deleterious effects of reflected light is to increase the absorption coefficient of the photo-resist. Essentially, the photo-resist is "dyed" so that it absorbs the wavelength of light used during the exposure step. In this way, the reflected light can be prevented from traveling an extended distance through the photo-resist. However, the dye attenuates the incident light as well as the reflected light. Therefore, the intensity of incident radiation diminishes as it travels through the photo-resist. As such, these dyes necessitate much higher exposure doses than the typical transparent photo-resist. Furthermore, use of these dyed resists can result in underexposure of the bottom region of the photo-resist material and overexposure of the top region. This can again result in unacceptable resist profiles.

To overcome these problems, an alternative method has been suggested involving the application of a first coating of a reflective suppression material on top of the substrate before the photo-resist is applied. This coating reduces the amount of light reflected from the underlying substrate during the photo-resist step. In this way the amount of reflected light is reduced without causing the actinic radiation to be attenuated as it travels through the photo-resist. Exemplary anti-reflective coatings of this type include inorganic materials such as $Cr_2O_3$, or TiW. Although these materials are effective at reducing the amount of light reflected from the substrate topography, they are difficult to apply uniformly onto the substrate and difficult to remove after the exposure step. As such, these materials often remain and become incorporated into the device. Since the nature of these materials can be incompatible with the final device, these materials are often unsuitable for general use as anti-reflective coatings.

Anti-reflective coatings formed from organic materials also have been suggested for use in reducing the deleterious effects of reflective light. These organic materials can also be spun onto the surface of the substrate prior to application of the photo-resist material. These materials can include a polymer dye that is absorptive either at a specific wavelength or at a broad range of wavelengths. As in the case of the dyed photo-resist, these coatings work by attenuating the actinic radiation as it passes through the anti-reflective coating. Although these materials are effective at absorbing light over a wide range of wavelengths, they have been found to be largely ineffective at shorter wavelengths of light such as 193 nm. Therefore, these materials are less useful at the wavelengths that produce sub-micrometer design features.

Furthermore, many of these anti-reflective coatings can diffuse into photo-resist materials. These coatings that migrate into the photo-resist material can poison the resist chemistry that occurs during the exposure step. As such, these materials have a deleterious impact on line widths and resist profiles.

At least one research group has proposed anti-reflective coatings for use at 193 nm. In an article entitled, "An Anti-Reflection Coating for Use With PMMA at 193 Nanometers", Yen et al. *J. Electrochem. Soc.*, Vol. 139, No. 2, February 1992, at pages 616–619, researchers suggest an anti-reflective coating can be developed that is specifically tailored for the 193 nanometer wavelength. However, the materials disclosed within this paper, must be photoactivated in a separate step by radiating the coated substrate with deep UV (260 nanometer) radiation and subsequent annealing. Moreover, it appears that the disclosed anti-reflection coating is adapted for use only with PMMA photo-resists. Although the PMMA is a commonly used photo-resist material it is not considered a candidate material for volume production of sub-0.25-micrometer features.

As the properties of photo-resists differ considerably from one type of photo-resist to another, there exists a need for more compatible and more suitable materials and methods for reducing the amount of reflected light that occurs during the photo-lithographic process. In particular, an anti-reflective coating for use at 193 nanometers that is optically compatible with the more complex, multi-component photo-resist materials, and which is substantially insoluble within these photo-resist materials, would overcome a major obstacle to the practicality of 193 nanometer photo-lithography.

SUMMARY OF THE INVENTION

Anti-reflective coatings and methods for forming these anti-reflective coatings are disclosed that have a polymer chemistry and optical characteristics suitable for suppressing the light that reflects off a substrate during a photo-lithographic process. These anti-reflective coatings include a phenolic polymer material and an epoxide-containing polymer material that can be combined in a select proportion to form a thermally curable polymeric anti-reflective coating. The select proportions of the combined materials tailors the optical characteristic of the anti-reflective coating to attenuate energy about a select range of wavelengths.

Anti-reflective compounds and methods for forming these anti-reflective compounds are disclosed. Anti-reflective compounds are described which can serve to reduce the amount of actinic radiation reflected off a substrate topography. In one embodiment, the present invention describes a material for use as a 193 nanometer anti-reflective coating. Other embodiments are disclosed for use at other wavelengths including 248 nanometers.

The anti-reflective compounds of the present invention can be formed from a polymeric material containing an epoxide ring and an aromatic group. The material can be a polymeric blend containing a polymer acrylate or methacrylate resin with at least some epoxide containing unit, such as dicyclopentadienyloxy methacrylate (DCPOMA), and some phenol-formaldehyde polymer, such as meta-cresol novolac. The polymeric material can be a polymer blend, a copolymer, a terpolymer, or another similar polymer composition. The epoxide containing moiety can act as a cross-linking agent when the film is thermally cured, whereas the aromatic compound can be used to tailor the complex refractive index of the anti-reflective coating. The tailored compound can be used to attenuate light around a selected wavelength, such as 193 nm. Once this polymer blend is thermally cured, typically at temperatures between 100° to 200° C., it is insoluble in photo-resists and casting solvents and hence compatible with conventional photolithographic processing.

The term polymer is used herein to describe a structure that has a backbone formed of repeating units, typically monomers. The backbone can be formed from a single repeating unit, and therefore can be a homogenous chain. Alternatively, the backbone can be formed of two different repeating units, thereby forming a copolymer. The two different repeating units can be present in the copolymer in different amounts. The ratio of one unit to the other is a representation of the repeated heterogeneous structure of the copolymer. Similarly, the backbone can be formed of three different repeating units, thereby forming a terpolymer. The different repeating units can be present in the terpolymer in different amounts. The relative presence of each unit can be expressed as a ratio. The ratio represents the basic pattern of units that can form the terpolymer. The term copolymer is used herein to reference that class of polymer structures formed from plural monomer groups and is understood to describe copolymers, terpolymers, tetra polymers and so forth. Additionally, the term copolymer is understood to describe block and graft copolymer structures.

The term polymeric material is used herein to describe a material formed of blended or copolymerized polymers. Blended polymeric materials can be polymer materials dissolved in a suitable solvent, such as propylene gylcol monomethyl ether acetate (PGMEA), cyclohexanone, cyclopentanone, 2-methoxy ethyl phenone, ethylene glycol monomethyl ether acetate (EGMEA), and mixtures thereof, and processed by means generally known in the art of polymer chemistry to produce a blend of materials. The relative presence of one polymer material within the blend can be expressed as a percent by weight, or weight percent, that expresses the weight fraction of the blend attributable to a particular polymer material.

Copolymers, terpolymers, and more diverse structures can be formed using polymerization techniques that allow two or more unsaturated compounds to mix and polymerize together. The resulting polymer can contain units of all the combined polymers in a distribution that ranges from a strict alteration to complete randomness.

The term polymerization is used herein to describe these techniques, including addition polymerization and condensation polymerization, that are generally known in the art of polymer chemistry for forming block or graft polymers.

The term deep ultraviolet radiation or deep UV is used herein to describe the band of electromagnetic radiation approximately between about 250 nm and the vacuum cutoff at approximately 185 nm.

The present invention can employ various acrylate structures that have an epoxide containing moiety. The term epoxide is used herein to describe the three membered ring molecular structure that contains an oxygen atom between two bonded carbon atoms. The acrylate structure can be methyl acrylate, methyl methacrylate, or an acrylate structure that includes lower alkyls, halogens, or halogenated lower alkyls. The term "lower alkyls" is used herein to describe alkyl groups of one to eight carbon atoms, and preferably of one to five carbon atoms. The term "halogens" describes those elements selected from the group that includes fluorine, chlorine, bromine and iodine.

The acrylate structure can also include alkyl, cyclic, heterocyclic and polycyclic compounds. The term "heterocyclic" is used herein to define cyclic structures that have a ring formed of two or more elements, and the term "polycyclic" is used to define structures that are formed from two or more cyclic groups. The term "aliphatic" is used herein to describe non-aromatic open-chain compounds, and the cyclic compounds that resemble these open-chain compounds. This includes the alkanes, alkenes, alkynes, and their cyclic analogs.

In one embodiment, the polymeric blend can be formed from a copolymer of an epoxide containing monomer and an acrylate monomer, such as the DCPOMA/methyl methacrylate copolymer, which can be formed as an acrylate-type resin. The DCPOMA monomer, and equivalents of the DCPOMA monomer, can be included into to an acrylate-type polymer to form a copolymer structure having DCPOMA in the backbone of an acrylate-type polymer. The phenol-formaldehyde polymer and equivalents of phenol-formaldehyde polymers are understood as highly absorptive materials at 193 nanometers. In one embodiment of the present invention the copolymer is blended with a phenolic polymer, such as novolac or meta-cresol novolac, in such a way that the novolac acts as a dye for absorbing light having a wavelength of 193 nanometers.

In alternative embodiments, the copolymer can be formed from other epoxide containing monomers, such as dicyclopentadienyloxy acrylate, 2,3-epoxypropyl methacrylate, 2,3-epoxypropryl acrylate and equivalents, which are designed to thermally crosslink.

In a further alternative embodiment of the present invention, the anti-reflective compound can include an acid-generating cross-linking catalyst. The cross-linking catalyst is understood to affect further the cross-linking between the copolymer and the phenol-formaldehyde resin, thereby further rendering the anti-reflective coating insoluble in common developing solvents and photo-resist spin coatings. In another embodiment, the cross-linking catalyst can be a photoactivated catalyst responsive to either 193 nanometer radiation or another wavelength of actinic radiation. This structure allows the coating to cross-link at the exposure radiation of the photo-lithographic process.

In another alternative embodiment of the present invention, the anti-reflective compound can be formed by polymerizing an aromatic compound, such as styrene or a styrene derivative, with an aliphatic epoxy-containing compound, such as 2,3-epoxy isoprene, 2,3-epoxy butadiene, or 2,3-epoxy propylmethacrylate. The aromatic compound is understood as highly absorptive of deep UV wavelengths, and the epoxy-containing aliphatic compound is understood as transparent to deep UV wavelengths. The resulting polymer can have a repeating structure that is tailored to have a selected complex index of refraction. Thermally curing the formed polymer, cross-links the material to make it insoluble in photo-resist materials.

In another aspect of the present invention, methods for forming anti-reflective compounds are disclosed. The methods can include steps for forming a copolymer having an epoxide containing monomer within the backbone of an acrylate-type polymer. The copolymer is blended in a proper proportion with a phenol-formaldehyde polymer to obtain a selected complex refractive index. The complex refractive index can be selected so that light incident on the anti-reflective coating/photo-resist interface is substantially absorbed by the coating. In a subsequent step, the blended copolymer can be applied to the surface of a substrate. The applied blended copolymer can then be thermally cured at an elevated temperature, e.g., greater than about 150° C., so that within the copolymer structure, the epoxide containing monomer cross-links with the phenol-formaldehyde resin, rendering the anti-reflective coating insoluble to common developing solvents and the photo-resist material. This method can include the further steps of determining from the topography of the substrate the variation in anti-reflective coating thickness. The anti-reflective coating can be blended to tailor a complex refractive index that is suitable for this range of coating thicknesses.

Similarly, the methods can include steps for forming a copolymer having an epoxide containing monomer and having an aromatic containing monomer. The monomers are polymerized in a proper proportion to obtain a selected refractive index. The refractive index can be selected so that light incident on the anti-reflective coating/photo-resist interface is substantially absorbed by the coating. In a subsequent step the copolymer can be applied to the surface of a substrate. Again, the applied copolymer can be thermally cured at temperatures greater than about 150° C. so that the epoxide groups form cross-links between the copolymers rendering the anti-reflective coating insoluble within developing solvents and within photo-resist materials. This method can include the further step of determining from the topography of the circuit substrate the variation in anti-reflective coating thickness. The copolymer can be formed with unit ratios suitable across the measured range of coating thicknesses.

The invention will next be described in connection with certain illustrated embodiments; however, it should be clear by those skilled in the art of polymer chemistry that various modifications, additions and subtractions can be made without departing from the spirit or the scope of the present invention.

DETAILED DESCRIPTION OF THE INVENTION

In one aspect of the present invention a polymeric material is disclosed that attenuates a specific wavelength, or a range of wavelengths, of radiating energy. This material can be used as an anti-reflective coating during the photolithographic fabrication of an integrated circuit that suppresses the effects of reflected light.

Figure 1:
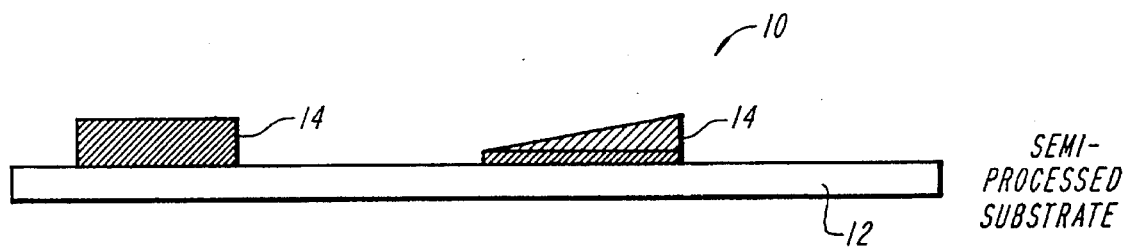
FIG. 1 illustrates a partially formed integrated circuit being processed by photo-lithography.
Figure 2:
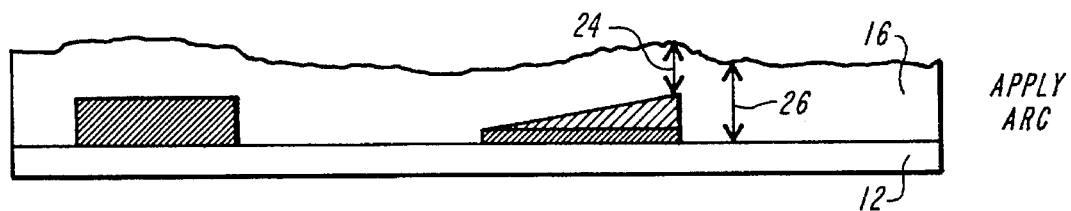
FIG. 2 illustrates the partially formed circuit of FIG. 1 coated with an anti-reflective coating of the present invention.
Figure 3:
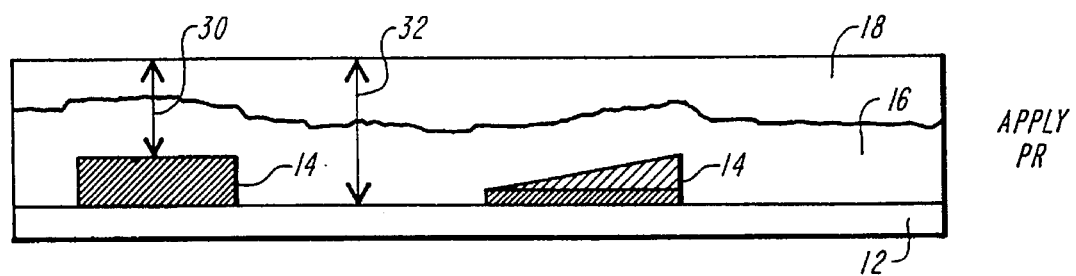
FIG. 3 illustrates the circuit of FIG. 2 coated with a photo-resist.
Figure 4:
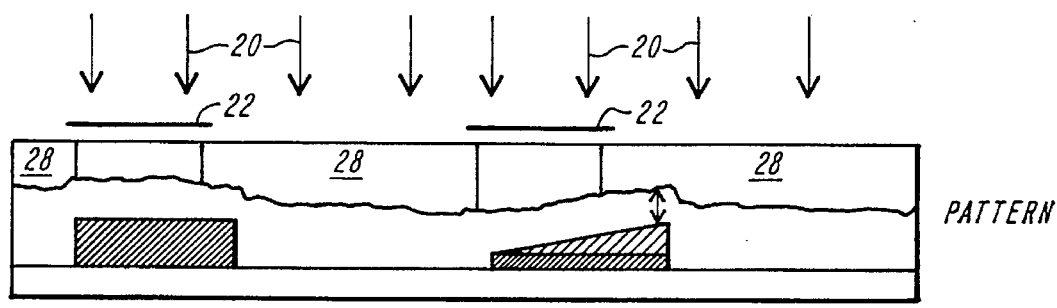
FIG. 4 illustrates the circuit of FIG. 3 being patterned by actinic radiation.
Figure 5:
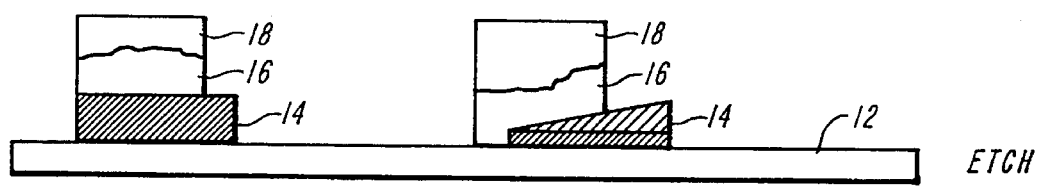
FIG. 5 illustrates the integrated circuit during the etching of the exposed regions.
Figure 6:
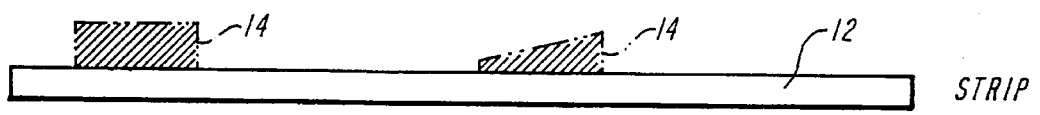
FIG. 6. illustrates the processed integrated circuit.

With reference to FIGS. 1–6, the use of this polymeric material as an anti-reflective coating can be explained. FIG. 1 illustrates an integrated circuit device 10 being fabricated. The device 10 includes a substrate element 12 that can be made of silicon, silicon oxide or any common substrate material, and circuit elements 14 that can be formed from aluminum (Al), silicon-nitride ($Si_3Ni_4$), or any material useful for forming circuit elements. FIG. 2 illustrates the integrated circuit device 10 of FIG. 1 with an anti-reflective coating 16 of the present invention applied on top of the substrate element 12 and the circuit elements 14. As illustrated, the anti-reflective coating 16 forms an uneven layer over the device 10. The height of the coating profile varies, at least in part, in relation to the underlying circuit topography, as illustrated at locations 24 and 26. FIG. 3 illustrates the anti-reflective coating 16 covered with a photo-resist material 18. The illustrated photo-resist applies as a thin, smooth layer on top of the anti-reflective coating 16. The anti-reflective coating 16 of the present invention has a polymer structure, described in greater detail hereinafter, that is insoluble in most photo-resist materials and therefore has utility with a wide variety of proprietary and commercially available photo-resists including PMMA and chemically amplified photo-resists. FIG. 4 illustrates a further step of the photolithographic process, where the photo-resist 18 and anti-reflective coating 16 are exposed to actinic radiation 20 through a photo mask 22. FIG. 5 illustrates the device 10 having been patterned by radiation and being etched by any of the wet or dry techniques used in the art of photo-lithography. FIG. 6 illustrates the processed device 10 having the processed circuit elements 14 patterned according to the exposure step depicted in FIG. 4.

With reference to FIG. 4 the effect of the anti-reflective coating 16 can be described. As depicted in FIG. 4, the actinic radiation 20 passes through portions of the mask 22 and is incident on the photo-resist 18. The photo-resist 18 is typically substantially transparent to the wavelength of the actinic radiation 20. As depicted by the region 28 of the photo-resist 18, the actinic radiation 20 can affect a photochemical reaction within the photo-resist 18. In the illustrated example the photo-resist is a positive-tone resist, such that the exposed regions; depicted as region 28, are rendered more easily removed during development. After passing through the photo-resist 18, the radiation 20 is incident at the interface between the photo-resist 18 and the anti-reflective coating 16. At the interface of two materials, an inconsistency can exist between the refractive indices. This mismatch is understood to cause reflections. The reflections are understood to be minimized if the indices of refraction of the photo-resist and the anti-reflective coating can be made substantially similar.

Additionally, the anti-reflective coating 16 can be tailored to attenuate the dose of actinic radiation 20 as it passes through a particular thickness or range of thicknesses of the anti-reflective coating 18. By properly selecting the proper attenuation factor of the anti-reflective coating 16, reflections from the substrate 12 can be suppressed.

The thickness of the anti-reflective coating 16 is affected by the topography of the substrate 12. As depicted by locations 30 and 32 in FIG. 3, the thickness of both the anti-reflective coating 16 and the photo-resist 18 can vary over the surface of the substrate 12. This variation in thickness is caused in a large part by the circuit elements 14. These circuit elements 14 are portions of the integrated circuit being developed on the substrate 12. Typically, these elements include wiring, capacitors and transistors. During each step of the photolithographic process layers of the circuit elements are developed and incorporated into the silicon substrate. Typically, the elements 14 are constructed from highly reflective materials such as aluminum (Al) and polycrystalline silicon. Consequently, light which travels through the photo-resist material 18 and the anti-reflective coating 16 is reflected by these circuit elements 14. The light reflected back from these circuit elements 14, interferes with the light that is incident on the photo-resist 18. Depending on the resist thickness, the resulting interference may be constructive or destructive and can cause the dose necessary to develop the photo-resist 18 to change as a function of the resist thickness. Typically, this thin film interference effect is referred to as the swing curve effect. The anti-reflective coating 16 placed between the photo-resist 18 and the circuit elements 14 and substrate 12 is understood to reduce the reflections that occur at the resist/substrate and/or resist/circuit element interfaces. It is understood that by reducing the reflections which occur at these interfaces, less reflected light interferes with the incident actinic radiation 20. In this way, the anti-reflective coating 16 also reduces the interference effect caused by the variations in the resist thickness.

With reference again to FIG. 4, it can be seen that some circuit elements 14 have a non-planar topography. It is understood that light that reflects off the surface of these circuit elements 14 is reflected at an angle back through the photo-resist 18. The anti-reflective coating 16 sits between these circuit elements 14 and the photo-resist 18. In this way, the anti-reflective coating 16 can reduce the amount of light that reflects off an inclined surface and that travels back through unexposed photo-resist 18. It is further understood that anti-reflective coating 16 placed between the circuit substrate 12 and the photo-resist 18 can be used to reduce the standing waves that result when photo-resist thickness is a whole number of wavelengths. Consequently, the anti-reflective coating 16 is can reduce wave profiles caused by these standing waves.

In a first embodiment of the present invention, the material compound can be a polymeric blend of two polymer materials. The first polymer material can be substantially transparent to the specific wavelength or range of wavelengths. This material can be a polymer with a backbone formed predominantly from an acrylate-type monomer, and that has incorporated into the backbone, a monomer with an epoxide group. The second polymer material can be a material that absorbs energy at a selected wavelength, or selected range of wavelengths. In one example, the selected wavelength is 193 nm and the absorbing material can be a phenol-formaldehyde compound. It is understood that the phenol-formaldehyde compounds are highly absorptive of 193 nm radiation.

In this embodiment, a first polymer of the blend can be a copolymer that can contain a free radical polymerizable monomer having at least one epoxide group in its molecular structure. A preferred example is dicyclopentadienyloxy methacrylate (DCPOMA), although other radical polymerizable monomers, such as glycidyl methacrylate (2,3-epoxypropyl methacrylate) can be employed in the present invention. The importance of the epoxide group is understood to be its high reactivity, which is due to the ease of opening the highly strained three membered oxygen containing ring. It is known that epoxides easily undergo reactions, particularly acid-catalyzed reactions. It is understood that the epoxide group of the present monomer affects crosslinks upon heating which bind to the phenol-formaldehyde polymer. As such, it is understood that the epoxide group aids in developing a coating that is more rigid and more insoluble to developing solvents and photo-resist casting solvents. This monomer can be incorporated through techniques known in the art of polymerization into the backbone structure of an acrylate-type composition.

Another epoxide-containing monomer suitable for use in the present invention is dicyclopentadienyloxy acrylate hereinafter (DCPOA). The DCPOA monomer is similar to the DCPOMA monomer except that it is an acrylate-containing moiety and lacks the methyl group of the DCPOMA monomer. In some applications the acrylate group distinguishes from the methacrylate group. In particular, the thermal-mechanical properties of the compound can be affected by selecting between the acrylate or methacrylate group. However, for most applications the materials can be substituted with only minor effect as both DCPOMA and DCPOA have substantially the same functional groups. Additionally, the methyl group of the DCPOMA monomer may be replaced, using the appropriate polymerization technique, with hydrogen, halogens, lower alkyls or halogenated lower alkyls. The addition of halogens is understood to affect the absorption coefficient of the wavelength of interest. Therefore it is understood that the addition of halogen groups can be effective to tailor the anti-reflective coating 16 to a particular wavelength of actinic radiation 20. For example, bromine is understood as strongly absorptive throughout the ultraviolet spectrum. Therefore, a bromomethyl group can be substituted for the methyl group to tailor the absorptive quality of the anti-reflective coating 16 to be more effective at deep ultra-violet wavelengths, where the phenol-formaldehyde material is not understood to be sufficiently absorptive. Similarly, chlorine is understood to be highly absorptive in the deep UV band. Therefore the substitution of a chlorine containing moiety can increase the absorbance band of the anti-reflective coating 16 to a longer wavelength in the deep UV band, such as 250 nm. Furthermore it is understood perfluorinated-oligomeric surfactants can be added to affect the solubility of the anti-reflective coating 16, to facilitate the use of low surface tension casting solvents that provide greater coverage over the surface topography of the substrate 12.

When alkyl groups are added to the epoxy-containing moiety they are understood to affect the solubility and phase compatibility of the anti-reflective coating 16. However, it appears that alkyl groups can be added to the monomer structure without effecting the functionality of the monomer. Further, it is understood that alkyl groups can be added to the monomer structure as long as the resultant anti-reflective coating 16 is insoluble in development fluids, and maintains phase compatibility in the polymer blend.

In a similar manner, alkoxy, hydroxyl and amino groups can be substituted for the methyl group of the DCPOMA monomer without affecting the functionality of the monomer and without departing from the scope of the present invention.

In other embodiments, the epoxide containing moiety can be glycidyl methacrylate (GMA) (IUPAC name 2,3-epoxypropyl methacrylate). As discussed above with reference to DCPOMA, the GMA monomer is understood to provide a reactive epoxide group that can crosslink the anti-reflective coating 16 during a thermal curing procedure. Again as discussed above with reference to DCPOMA, the GMA monomer has a basic functionality that is substantially independent from the present methyl group. It should be apparent to those skilled in the art of chemistry, that the basic functionality of the GMA monomer is not affected by substituting the methyl group with a hydrogen, lower alkyl, halogen or halogenated alkyl. The effect of these substitutions is to alter certain physical properties of the copolymer in a manner similar to that discussed with reference to DCPOMA, and is not seen as a departure from the scope of the present invention. Further, it should be apparent to one skilled in the art of resist chemistry that GMA, and its derivatives, can be more liable to cause epoxy-ring opening reactions than the DCPOMA compounds and can prematurely crosslink the anti-reflective coating if the coating is not kept in a stable environment.

The epoxy-containing monomer can be incorporated into the backbone of an acrylate-type polymer to form the copolymer of the polymer blend. The acrylate-type polymer can be a methacrylate, such as polymethyl methacrylate (hereinafter PMMA). PMMA is used for its desirable physical properties, such as its substantial transparency to light at wavelengths of 193 nm, and its phase compatibility with the phenol-formaldehyde class of acrylates. Furthermore, it is understood that the phase compatibility of the resultant polymer blend depends on the presence of PMMA in the backbone of the copolymer.

It should be apparent to those skilled in the art of resist chemistry, that other polymer structures are suitable with the present invention, including terpolymers, tetrapolymers, graft-copolymers and block copolymers, that include an epoxide group, are substantially transparent to the UV actinic radiation (190–400 nm) and are phase compatible with the phenol-formaldehyde class of acrylates.

In forming the polymer blend, the copolymer is blended in a selected proportion with a phenol-formaldehyde resin. In one preferred embodiment, the phenol-formaldehyde resin is selected to be meta-cresol novolac. However, it should be understood that many of the wide class of polymers that result from the reaction between phenols and formaldehydes have utility with the present invention. Particularly, those phenol-formaldehyde materials, novolacs, that have a solid or wax-like structure at room temperature, that are absorptive at the appropriate wavelength, and that are phase compatible with the acrylate component of the blended copolymer. Therefore, the phenol-formaldehyde resin is not to be limited to the above specific example.

The phenol-formaldehyde resin contains aromatic phenol groups which are understood as highly absorptive of radiation around 193 nm. Therefore, the relative amount of the phenolic material in the polymer blend can determine the resultant absorptive properties of the anti-reflective coating 16. The phenol-formaldehyde resin can be blended with the copolymer using techniques known generally in the art of polymer chemistry. In one example, appropriate weights of both polymer materials can be selected to yield a complex refractive index compatible with a selected photo-resist material and a specific wavelength of radiation, for example 193 nm. The polymer materials are dissolved in a PGMEA solvent. The admixture is processed, by means generally known in the art, to remove the solvent material and the blended material is usable as an anti-reflective coating.

In alternative embodiments of the anti-reflective coating 16 of the present invention, the coating 16 can further include a photo-activated catalyst for cross-linking the coating by exposure to radiation or a select wavelength of radiation.

In a further alternative embodiment of the present invention, the anti-reflective coating 16 can be formed by polymerizing an aromatic compound, such as styrene or a styrene derivative, with an aliphatic epoxy-containing compound, such as 2,3-epoxy isoprene, 2,3-epoxy butadiene, or 2,3-epoxy propylmethacrylate (GMA). The aromatic compound is understood as highly absorptive of deep UV wavelengths, and the epoxy-containing aliphatic compound is understood as transparent to deep UV wavelengths and effective to crosslink in the anti-reflective coating. The resulting polymer can have a repeating structure that is tailored to have a selected index of refraction. Thermally curing the formed polymer, cross-links the material to make it insoluble in photo-resist materials.

In a preferred example of this embodiment a copolymer is formed from monomers of GMA and styrene. The GMA, the epoxy containing moiety, is present in the copolymer in an amount sufficient to affect the crosslinking necessary to make the copolymer insoluble in casting solvents and to prevent migration of the anti-reflective coating into the photo-resist material. The styrene, the aromatic containing compound, is present in the copolymer in an amount sufficient to attenuate the actinic radiation as it passes through the anti-reflective coating 16. In a preferred embodiment, the monomers are in a 1:1 ratio to form an anti-reflective coating suitable for suppressing reflections of 193 nm radiation. In other embodiments, the ratio is altered to increase the etch rate of the anti-reflective coating 16 in an oxygen plasma. In these embodiments, the epoxide containing monomer is present in a significantly higher ratio than the styrene monomer. Additionally, the halogenated alkyl groups can be added to the styrene monomer to maintain sufficient absorbance in the deep UV band, while reducing the ratio of the aromatic monomer. Again, it should be apparent to those skilled in the art of polymer chemistry that the basic functionality of the copolymer anti-reflective coating can be achieved in a more diverse polymer structure including terpolymers, tetra polymers and graft polymers.

As discussed above with reference to the polymer blend anti-reflective coating, the methyl group of the styrene monomer can be substituted with other groups to affect the absorbance and etching properties of the anti-reflective coating 16. These groups can include $CH_3$, $CH_2Cl$, $CH_2Br$, $NO_2$ and $NH_2$. The halogenated methyl groups can increase the absorbance band of the anti-reflective coating. Similarly, $NO_2$ is understood to increase the absorbance band of the anti-reflective coating to as far as 300 nm.

Now, the present invention will be described in further detail with reference to a specific example of the preferred embodiment. However, it should be understood that the present invention is by no means restricted by such specific example. It should be further understood that the imaged wafers produced by applicant have been routinely examined under an electron microscope. The examinations have revealed that the interference effect and the standing wave effect produced by reflected light have been eliminated.

An anti-reflective coating according to the present invention is formulated for use at 193 nm and with a thicknesses of approximately 100–200 nm. The anti-reflective coating is formed by:

Blending meta-cresol novolac with a copolymer of DCPOMA and PMMA. The copolymer has a ratio of about 1:3 DCPOMA to PMMA monomers. The blend is about 40 weight percent meta-cresol novolac.

The anti-reflective coating is applied over the substrate topography with a thickness of 100–400 nm. The anti-reflective coating is cured at temperatures greater than 170° C. for more than 10 minutes. Pattern transfer can be accomplished with oxygen reactive etching, and the coating can be removed via wet etchant such as Nanostrip or by dry etching with a $CF_4/O_2$.

The 40 weight percent of meta-cresol novolac is selected to achieve an anti-reflective coating for 193 nm photolithography that yields reflectivities of less than 1%. This weight percent can be determined by using spectroscopic ellipsometry or reflectivity methods as are known in the art. In the above example, seven samples of the anti-reflective coating were prepared, each having a different weight percent of meta-cresol novolac. In six samples, the weight-percent of novolac ranged from zero (0) to twenty-five (25%) percent. The seventh sample was one-hundred (100%) percent pure novolac. Each sample was analyzed using a spectrophotometer. In particular, each sample was analyzed with an ArF excimer laser and an ultraviolet (UV) spectrophotometer. The UV spectrophotometer was used to determine the absorption coefficient, $\alpha$, of the sample material. The absorption coefficient, $\alpha$, is understood as related to the complex component $\kappa_s$, of the complex refractive index, N, represented by:

$$N = n_s + i\kappa_s. \tag{1}$$

The complex component of the refractive index, $\kappa_s$, can be computed according to Equation (2) where $\lambda$ is 193 nm.

$$\kappa_s = \frac{\alpha \lambda}{4\pi} \tag{2}$$

Once $\kappa_2$ has been determined, the reflectivity, $r^2$, of the sample is experimentally measured using techniques generally shown for measuring light reflections from a surface and the Fresnel equations can be solved according to Equations 3–6 to determine the real part of the complex refractive index, $n_s$.

$$r_s^2 = \frac{(\cos\theta - u)^2 + v^2}{(\cos\theta + u)^2 + v^2} \tag{3}$$

$$r_p^2 = \frac{((n_s^2 - \kappa_s^2)\cos\theta - u)^2 + (2n_s\kappa_s\cos\theta - v)^2}{((n_s^2 - \kappa_s^2)\cos\theta + u)^2 + (2n_s\kappa_s\cos\theta + v)^2} \tag{4}$$

Equation (3) can be used for the s-polarization and equation (4) for the p-polarization, where $\theta$ is the angle of incidence relative to the normal. The functions u and v are defined in Equations (5) and (6), respectively. Equations (3) through (6) assume the refractive index of air to be 1.000 at 193 nm.

$$2u^2 = (n_s^2 - \kappa_s^2 - \sin^2\theta) + \sqrt{(n_s^2 - \kappa_s^2 - \sin^2\theta)^2 4n_s^2\kappa_s^2} \tag{5}$$

$$2v^2 = -(n_s^2 - \kappa_s^2 - \sin^2\theta) + \sqrt{(n_s^2 - \kappa_s^2 - \sin^2\theta)^2 + 4n_s^2\kappa_s^2} \tag{6}$$

In a preferred method, reflectivity measurements are carried out near normal incidence ($\theta = 0$), where $r_s = r_p$, to effectively eliminate sample/beam orientation effects that result from the slight degree of polarization in the excimer laser. The real part of the substrate refractive index, $n_s$, can then be calculated by plugging in values for $r_s$, $r_p$, $\theta$, and $\kappa_s$, and by solving numerically for $n_s$. This method is best suited for measurement of relatively opaque materials ($\alpha > 3$ $\mu m^{-1}$) which could also be deposited on fused silica substrates in much thinner layers for the spectrophotometry measurements.

Figure 7:
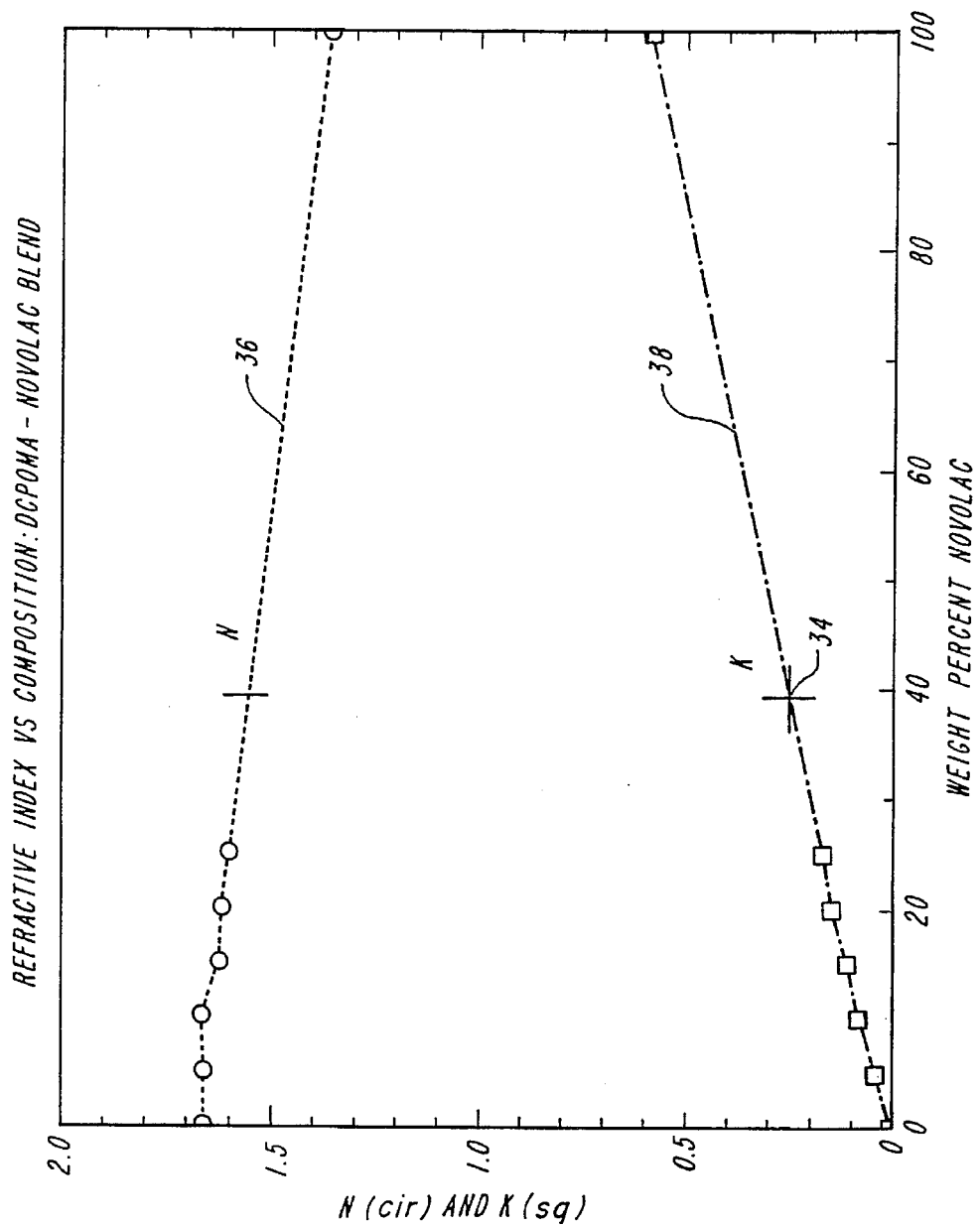
FIG. 7 graphically depicts the refractive index of an anti-reflective coating as a function of the weight percent of a phenol formaldehyde compound.

The results of the analysis for the real and complex components of the refractive index were plotted as two separate functions, 36 and 38, on the graph depicted in FIG. 7 illustrating the complex refractive index as a function of weight percent of novolac, and the data was extrapolated to obtain estimated measurements of the refractive index over the range of weight percents from zero (0) to one-hundred (100 %) percent novolac.

Figure 8:
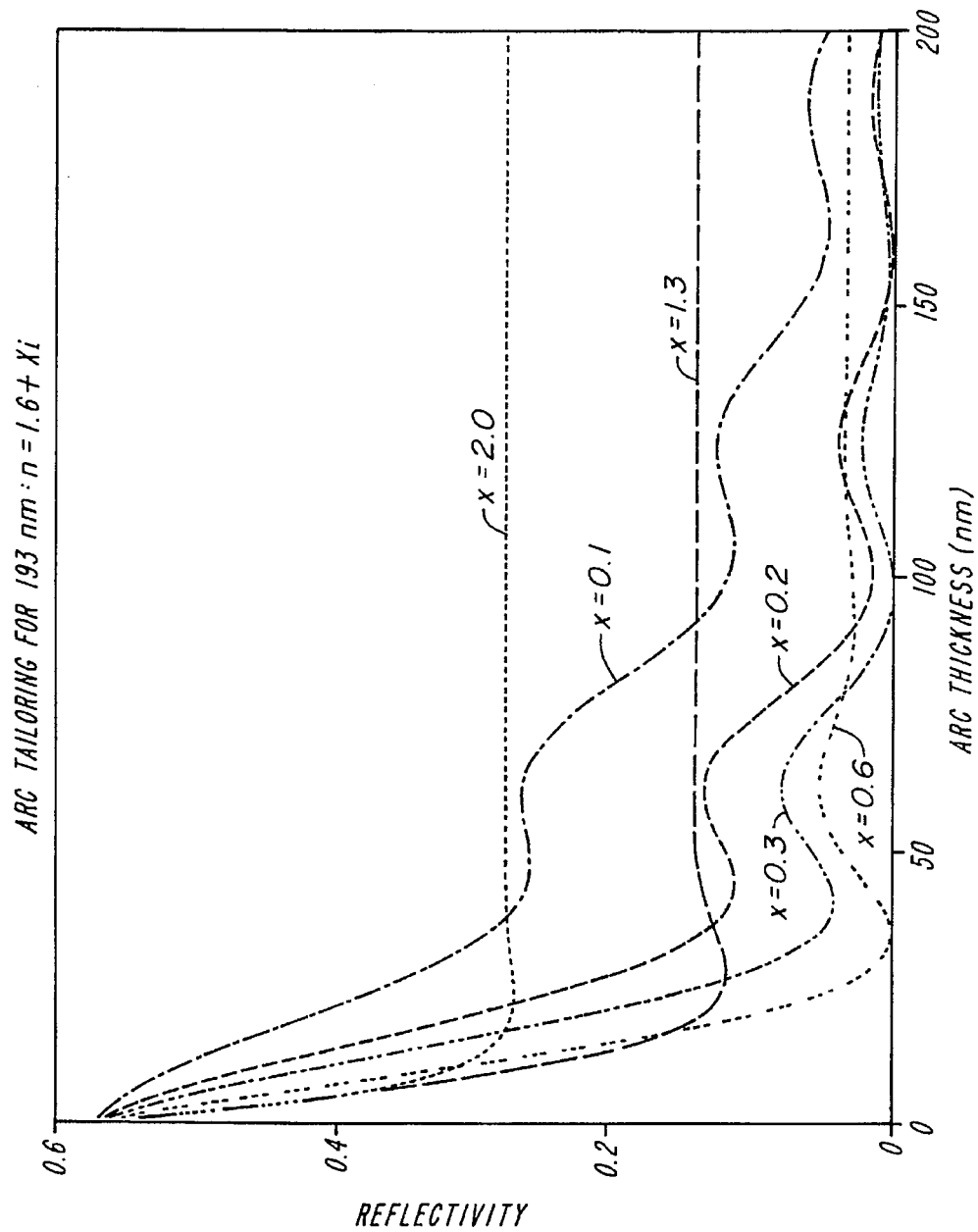
FIG. 8 graphically depicts the reflectivity of an anti-reflective coating according to the invention as function of coating thickness.

Computer models of the optical properties of the anti-reflective coating were generated using commercially available software, such as Prolith/2, sold by Finle Technologies. The computer models were used to generate curves depicted in FIG. 8 that illustrate the reflectivity of the anti-reflective coating at 193 nm over a range of coating thicknesses. The desired reflectivity, approximately one (1%) percent, over the desired range of the thicknesses, approximately 100 nm, can be determined and the corresponding complex refractive index identified. The identified complex refractive index was located on the graph in FIG. 7 of novolac weight compositions to find the desired weight percent of novolac. Point 34 on FIG. 7 illustrates the point on the plotted function of $\kappa$, 38, where the complex refractive index is approximately 0.25 and the corresponding weight percent was identified as approximately 40 weight percent novolac.

Results of pattern transfers with the above anti-reflective coating illustrate that the coating can be used for writing patterns of less than 0.5 micrometers over pattern features with vertical topography exceeding 0.5 micrometers.

It will be appreciated by those skilled in the art that variations in the invention disclosed herein may be made without departing from the spirit of the invention. In particular, a polymer blend anti-reflective coating effective at 248 nm can be formulated by the above described methods, where samples are prepared for testing at 248 nm to determine the complex refractive index as a function of weight percent novolac and the appropriate weight percent of novolac is established according to the computer modeling procedures described above. Additionally, copolymer anti-reflective samples can be prepared according to generally known polymerization techniques, and tested with the above described method to define the monomer ratios for the desired photo-lithographic process. Therefore, the invention is not to be limited by the specific embodiments disclosed herein, but only by the scope of the claims appended hereto.

What is claimed:

1. An anti-reflective, light-attenuating, photolithography coating composition comprising:

a phenol-formaldehyde novolac polymer which attenuates actinic radiation to inhibit reflection artifacts during photolithography; and a polymer having a first repeating unit of methylmethacrylate, and having a second repeating unit selected from the group consisting of:

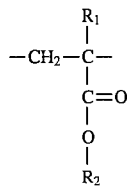

wherein $R_1$ represents a hydrogen, a halogen, a lower alkyl, or a halogenated lower alkyl and, $R_2$ represents a moiety containing an epoxide and selected from a group including alkyls, alkenyls, alkynyls, aryls, heterocycles, and polycycles;

said composition being about 30–70 percent by weight phenol-formaldehyde novolac polymer.

2. An anti-reflective coating composition according to claim 1 wherein said second repeating unit is dicyclopentadienyloxy methacrylate, and wherein the ratio of dicyclopentadienyloxy methacrylate to methyl methacrylate ranges between about 1:5 to 4:5.

3. An anti-reflective coating composition according to claim 1 wherein said second repeating unit is dicyclopentadienyloxy acrylate, and wherein the ratio of dicyclopentadienyloxy acrylate to methyl methacrylate ranges between about 1:5 to 4:5.

4. An anti-reflective coating composition according to claim 1 wherein said second repeating unit is 2,3-epoxypropyl methacrylate, and wherein the ratio of 2,3-epoxypropyl methacrylate to methyl methacrylate ranges between about 1:5 to 4:5.

5. An anti-reflective coating composition according to claim 1 wherein said second repeating unit is 2,3-epoxypropyl acrylate, and wherein the ratio of 2,3-epoxypropyl acrylate to methyl methacrylate ranges between about 1:5 to 4:5.

6. An anti-reflective coating composition according to claim 1 wherein said phenol-formaldehyde polymer is meta-cresol novolac.

7. An anti-reflective coating composition according to claim 1 further comprising an acid generator cross-linking catalyst.

8. An anti-reflective coating composition according to claim 7 having a cross-linking catalyst that is photo-activated.

* * * * *